US 6,744,826 B2

(12) United States Patent
Rabii

(10) Patent No.: US 6,744,826 B2
(45) Date of Patent: *Jun. 1, 2004

(54) AGC WINDOW DETECTOR

(75) Inventor: Shahriar Rabii, Stanford, CA (US)

(73) Assignee: Intel Corporation, Santa Clara, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/265,765

(22) Filed: Mar. 10, 1999

(65) Prior Publication Data

US 2003/0091126 A1 May 15, 2003

Related U.S. Application Data

(63) Continuation-in-part of application No. 09/262,147, filed on Mar. 3, 1999, now abandoned.

(51) Int. Cl.[7] .................................. H04L 25/10
(52) U.S. Cl. ........................... 375/318; 327/58
(58) Field of Search ........................ 375/341, 322, 375/317, 318, 345; 327/72, 58, 62, 74, 50

(56) References Cited

U.S. PATENT DOCUMENTS

| 4,468,653 A | * | 8/1984 | Kapral | 341/150 |
|---|---|---|---|---|
| 4,503,340 A | * | 3/1985 | Linder | 327/72 |
| 4,543,498 A | * | 9/1985 | Gorecki | 327/72 |
| 4,855,722 A | * | 8/1989 | Mostyn et al. | 340/660 |
| 4,926,443 A | * | 5/1990 | Reich | 324/103 P |
| 5,202,762 A | * | 4/1993 | Fellinger | 327/74 |
| 5,444,417 A | * | 8/1995 | Botti et al. | 330/51 |
| 5,488,323 A | * | 1/1996 | Beacham et al. | 327/74 |
| 5,532,574 A | * | 7/1996 | Wolfe et al. | 322/37 |
| 5,903,220 A | * | 5/1999 | Jon et al. | 327/74 |
| 5,933,459 A | * | 8/1999 | Saunders et al. | 375/317 |
| 5,977,797 A | * | 11/1999 | Gasparik | 326/86 |
| 6,100,759 A | * | 8/2000 | Sirna et al. | 330/252 |
| 6,134,281 A | * | 10/2000 | Green et al. | 375/347 |
| 6,215,335 B1 | * | 4/2001 | Rabii | 327/74 |
| 6,232,815 B1 | * | 5/2001 | Turvey | 327/291 |
| 6,292,655 B1 | * | 9/2001 | Kondo | 455/295 |
| 6,304,136 B1 | * | 10/2001 | Rabii | 329/300 |
| 6,377,633 B1 | * | 4/2002 | Schneider | 375/317 |
| 6,469,547 B1 | * | 10/2002 | Rabii | 327/74 |

* cited by examiner

Primary Examiner—Tesfaldet Bocure
Assistant Examiner—Kevin M Burd
(74) Attorney, Agent, or Firm—Blakely, Sokoloff, Taylor & Zafman LLP

(57) ABSTRACT

An AGC window detector that senses the sum of an in-phase (I) and a quadrature (Q) peak-to-peak signal swing and compares the signal to a reference voltage for producing a desired gain. The primary design issues of the detector is to achieve a very low voltage offset and a low power dissipation. The detector is part of the AGC circuits in the I/Q path of a wireless receiver. The signals $I_{max}$, $I_{min}$, $Q_{max}$ and $Q_{min}$ are the positive and negative peak values of the in-phase and the quadrature waveforms, respectively. They are generated by a peak detector. Thus the differential in-phase and the differential quadrature amplitudes are $I_{max}-I_{min}$ and $Q_{max}-Q_{min}$, respectively. A resulting differential in-phase signal is added to a resulting differential quadrature signal by the detector and compared to the reference voltage to determine if the resulting signal is greater than a maximum reference voltage, less than a minimum reference voltage or within the maximum and minimum voltages. A reference voltage generator creates the desired voltages within a desired tolerance.

45 Claims, 6 Drawing Sheets

AGC WINDOW DETECTOR

CROSS REFERENCE APPLICATIONS

This is a Continuation-in-Part of U.S. patent application Ser. No. 09/262,147, filed on Mar. 3, 1999 now abandoned.

BACKGROUND OF THE INVENTION

1. Field of the Invention

This invention relates in general to an AGC window detector, and more particularly to an AGC window detector that determines whether a difference between input signals falls within a window.

2. Description of Related Art

Today's wireless communications markets are being driven by a multitude of user benefits. Products such as cellular phones, cordless phones, pagers, and the like have freed corporate and individual users from their desks and homes and are driving the demand for additional equipment and systems to increase their utility. As a result digital radio personal communications devices will play an increasingly important role in the overall communications infrastructure in the next decade.

Mixed-signal integration and power management have taken on added importance now that analog and mixed analog-digital ICs have become the fastest-growing segment of the semiconductor industry. Integration strategies for multimedia consoles, cellular telephones and battery-powered portables are being developed, as well as applications for less integrated but highly specialized building blocks that serve multiple markets. These building blocks include data converters, comparators, demodulators, filters, amplifiers and voltage regulators.

One important aspect of digital radio personal communications devices is the integration of the RF sections of transceivers. Compared to other types of integrated circuits, the level of integration in the RF sections of transceivers is still relatively low. Considerations of power dissipation, low offset budgets, form factor, and cost dictate that the RF/IF portions of these devices evolve to higher levels of integration than is true at present. Nevertheless, there are some key barriers to realizing these higher levels of integration.

For example, most applications provide a comparator circuit in an RF receiver system to compare different signals. For AGC window detectors, input signals are compared to a reference voltage and a resulting signal is used to drive a digital logic circuits to achieve a desired gain. However, the information received from the AGC window detector determines parameters such as: signal level budget, minimum gain step size, amplifier voltage limits, speed of input level variations due to multi-path fading and demodulator dynamic range. Input signal level regulation is critical for these components. To provide this regulation, the window detector implements circuitry which compares a peak-to-peak amplitude of an in-phase and a peak-to-peak amplitude a quadrature input signal to the reference voltage. A reference voltage source generates a reference voltage window that is used to determine if a resulting amplitude of the in-phase and amplitude of the quadrature input signal is less than, greater than, or equal to the reference voltage.

It can be seen then that there is a need for an AGC window detector to determine whether the difference between input signals falls within a window.

It can also be seen that there is a need for a window detector that compares input signals and drives digital circuits in response thereto to produce the desired gain.

SUMMARY OF THE INVENTION

To overcome the limitations in the prior art described above, and to overcome other limitations that will become apparent upon reading and understanding the present specification, the present invention discloses an AGC window detector that determines whether a difference between input signals falls within a window.

The present invention solves the above-described problems by providing an AGC window detector that determines whether the difference between input signals falls within a window by comparing input signals and driving digital circuits in response thereto to produce the desired gain.

A method in accordance with the principles of the present invention includes comparing a first input signal and a second input signal to a first reference voltage to produce a first output signal and comparing the first input signal and the second input signal to a second reference voltage to produce a second output signal, wherein the first and the second output signal indicates whether the difference of the first and second input signals are within a reference window defined by the first and the second reference voltages.

Other embodiments of a system in accordance with the principles of the invention may include alternative or optional additional aspects. One such aspect of the present invention is that the method further includes computing the difference between the value of the first input and second input signal.

Another aspect of the present invention is that the computing the difference between the value of the first and second input signal further includes computing the difference between a maximum in-phase signal value with a minimum in-phase signal value and computing the difference between a maximum quadrature signal value with a minimum quadrature signal value resulting in a differential in-phase value of the input signals and a differential quadrature value of the input signals respectively.

Another aspect of the present invention is that wherein the computing the difference between the in-phase and quadrature signal further includes sampling the differential in-phase and quadrature signals.

Another aspect of the present invention is that the sampling of the differential in-phase and quadrature signal further includes computing an addition and a subtraction of the differential in-phase and quadrature signal voltages to determine a polarity of a resulting voltage.

Another aspect of the present invention is that the subtraction of the differential in-phase and quadrature voltage further includes reversing the polarity of the positive and negative components of the in-phase and quadrature signal.

Another aspect of the present invention is that the computing of the addition and the subtraction further includes sampling the differential in-phase and quadrature voltage via a parasitic insensitive sampling network comprising a capacitor.

Another aspect of the present invention is that the parasitic insensitive sampling further includes accomplishing the addition and the subtraction by a charge sharing of parallel capacitors.

Another aspect of the present invention is that the sampling of the differential in-phase and quadrature signal further includes preamplifying a low level signal.

Another aspect of the present invention is that the sampling of the differential in-phase and quadrature signal further includes latching a voltage level.

Another aspect of the present invention is that the sampling of the differential in-phase and quadrature signal further includes generating two nominally identical voltages to reduce cross talk in a preamplified low level signal.

Another aspect of the present invention is that the method further includes providing a reference voltage.

Another aspect of the present invention is that the providing of the reference voltage further includes generating all needed reference voltages from a single source.

Another aspect of the present invention is that the providing of the reference voltage further includes providing a control signal to regulate the reference voltage wherein the control signal varies a hysteresis window.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout.

DETAILED DESCRIPTION OF THE INVENTION

In the following description of the exemplary embodiment, reference is made to the accompanying drawings which form a part hereof, and in which is shown by way of illustration the specific embodiment in which the invention may be practiced. It is to be understood that other embodiments may be utilized as structural changes may be made without departing from the scope of the present invention.

The primary design issues of a window comparator such as the AGC window detector is to achieve a very low voltage offset and a low power dissipation. The window detector is part of the AGC circuits in the I/Q path of a wireless receiver. The maximum and minimum signals, $I_{max}$, $I_{min}$, $Q_{max}$ and $Q_{min}$, are the positive and negative peak values of the in-phase and the quadrature signals, respectively. The in-phase and quadrature signals are generated by a peak detector. Thus, a differential in-phase signal and a differential quadrature signal amplitude is $I_{max}-I_{min}$ and $Q_{max}-Q_{min}$, respectively. The differential in-phase signal is referred to as the in-phase peak-to-peak signal and a differential quadrature signal is referred to as the quadrature peak-to-peak signal. The differential in-phase signal is added to a the differential quadrature signal by the detector and compared to the reference voltage to determine if the resulting signal is greater than a maximum reference voltage, less than a minimum reference voltage or within the maximum and minimum voltages.

In a transceiver system, the transmitter and receiver are never on simultaneously. In operation, data is bursted by the RF transmitter at more than twice the rate of the continuous input data to be transmitted for less than half the time. The far end receiver stores up the bursted data to be read out of a memory at a slower continuous pace. The RF medium, however, typically introduces DC offset voltages. The AGC window detector senses the sum of the in-phase and the quadrature channel peak-to-peak signal swings to cancel these offset voltages. The AGC window comparator output, in conjunction with an offset comparator output, drive the digital logic circuits that ultimately serve to acquire the desired gain in a system.

Figure 1:
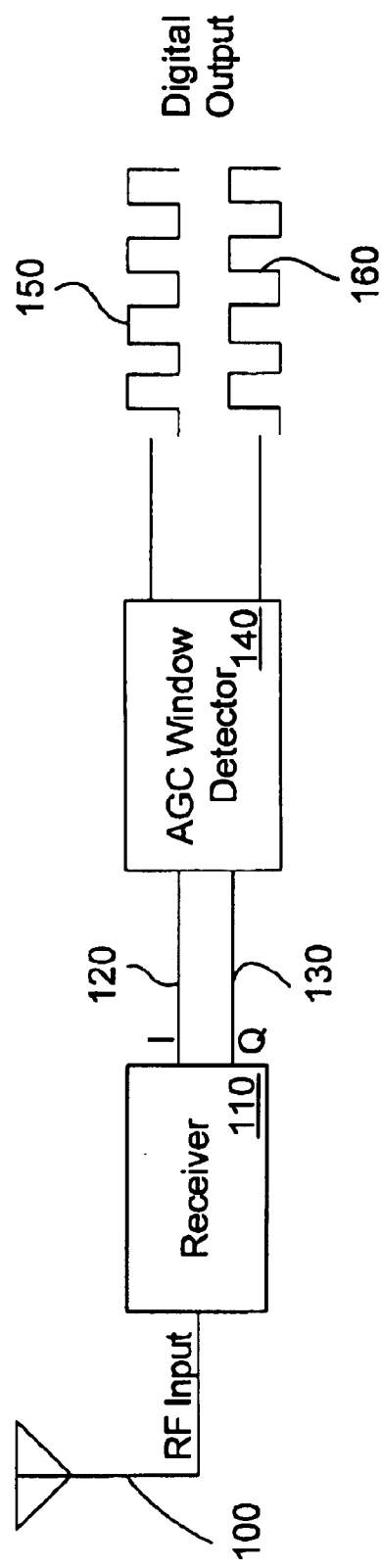
FIG. 1 is an exemplary diagram showing the AGC window detector in a typical radio receiver system.

FIG. 1 is an exemplary diagram showing the AGC window detector in a typical radio receiver system. An RF signal is received by an antenna 100 and is routed into receiver system 110. The outputs from the receiver system are the input signals to the AGC window detector 140. The input signals comprise of an in-phase (I) signal 120 and a quadrature (Q) 130 signal. The detector's output is a two-bit digital data waveform 150, 160 capable of providing three values.

Figure 2:
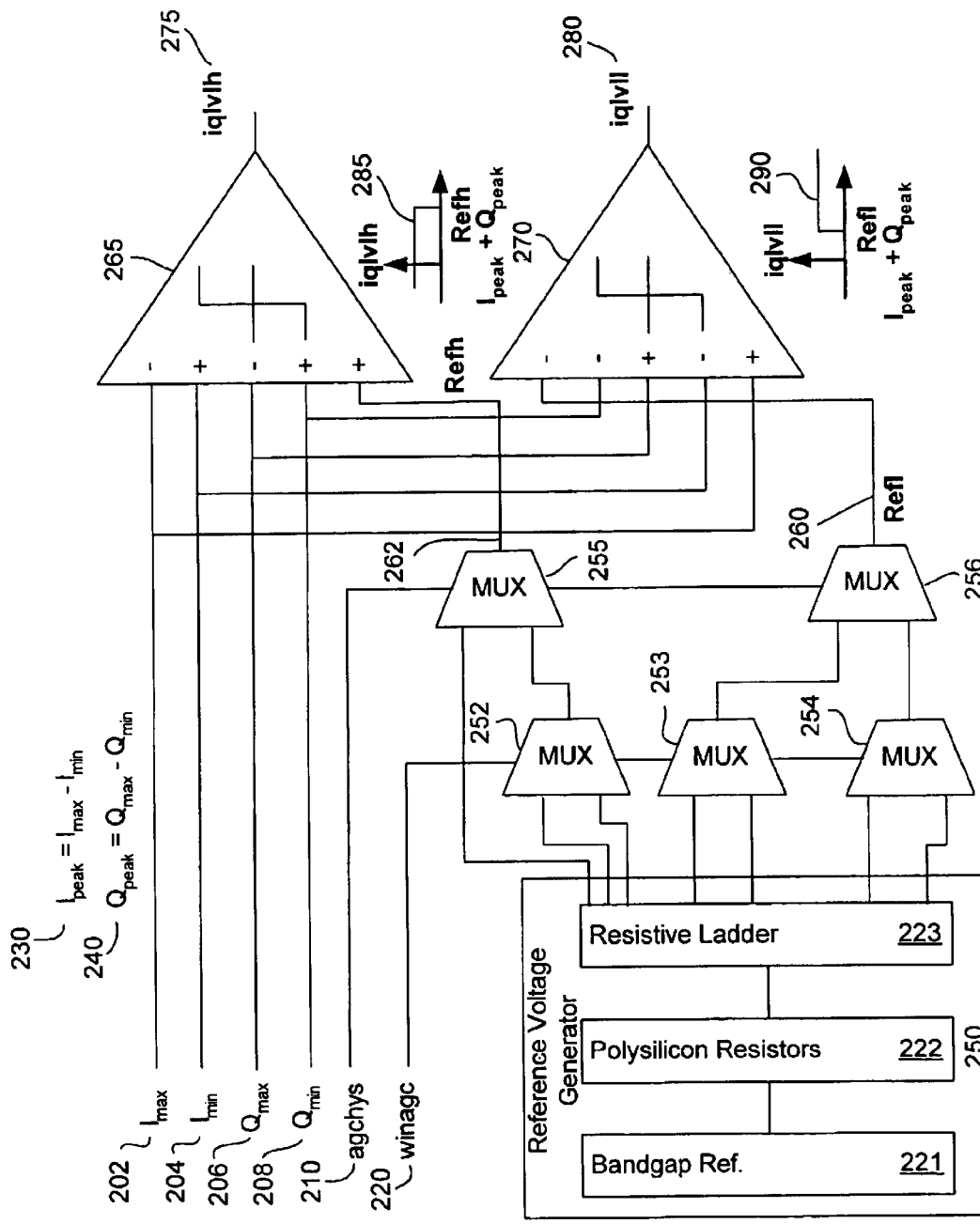
FIG. 2 is a block diagram of an AGC window detector circuit.

FIG. 2 is a block diagram of an AGC window detector. The comparators 265, 270 are capable of addition and subtraction of five differential analog voltages simultaneously and determining the polarity of a resulting voltage. The input voltages $I_{max}$ 202, $I_{min}$ 204, $Q_{max}$ 206, $Q_{min}$ 208 and a high level reference voltage (Refh) 262 are inputs to the comparator 265. $I_{max}$ 202, $I_{min}$ 204, $Q_{max}$ 206, $Q_{min}$ 208 and a low level reference voltage (Refl) 260 are input to the second comparator. The comparators sample the voltages via a parasitic insensitive sampling network via a capacitor during phase one of the clock cycle.

During phase 2 of the clock cycle the sampling capacitors are placed in parallel and the addition and subtraction operations are accomplished by charge sharing. The polarity of an input can be reversed by tying its positive component to a negative side of the comparators sampling network and its negative component to a positive side of the sampling network. Thereby subtraction can be accomplished as easily as addition. The differential signal $I_{peak}$ 230, $I_{max}$ minus $I_{min}$, and a differential signal $Q_{peak}$ 240, $Q_{max}$ minus $Q_{min}$, are added together and compared to the reference voltage to produce a two bit digital signal, a high level indicator (iqlvlh) 275 and a low level indicator (iqlvll) 280, with three possible values.

The inset graph of iqlvlh 275 versus $I_{peak}+Q_{peak}$ 285 depict when $I_{peak}$ plus $Q_{peak}$ are greater then Refh the output 275 will go low. The inset graph iqlvll 280 versus $I_{peak}+Q_{peak}$ 290 depicts when $I_{peak}$ plus $Q_{peak}$ are greater then Refl the output will go high. The combination of iqlvlh 275 and iqlvll 280 will produce the two bit output which can take three possible states indicating whether the signal level is above Refh 262, below Refl 260, or within the window created by Refl 260 and Refh 262 voltages.

The reference voltage generator 250 creates the desired voltages, e.g., using a a current from a bandgap generated reference 221 that is inversely proportional to the resistance in polysilicon resistors 222. By forcing the current across a resistive ladder 223, all needed voltages can be generated. The system can tolerate a plus or minus 5% error in reference voltages without significant performance degradation. A reference voltage generator output is selected with the control signals agchys 210 and winagc 220. The control signals agchys 210 and winagc 220 control multiplexors 252, 253, 254, 255, 256 that select the output provided by the reference voltage generator 250. These signals allow a change in the signal level by varying an AGC hysteresis window.

Figure 3:
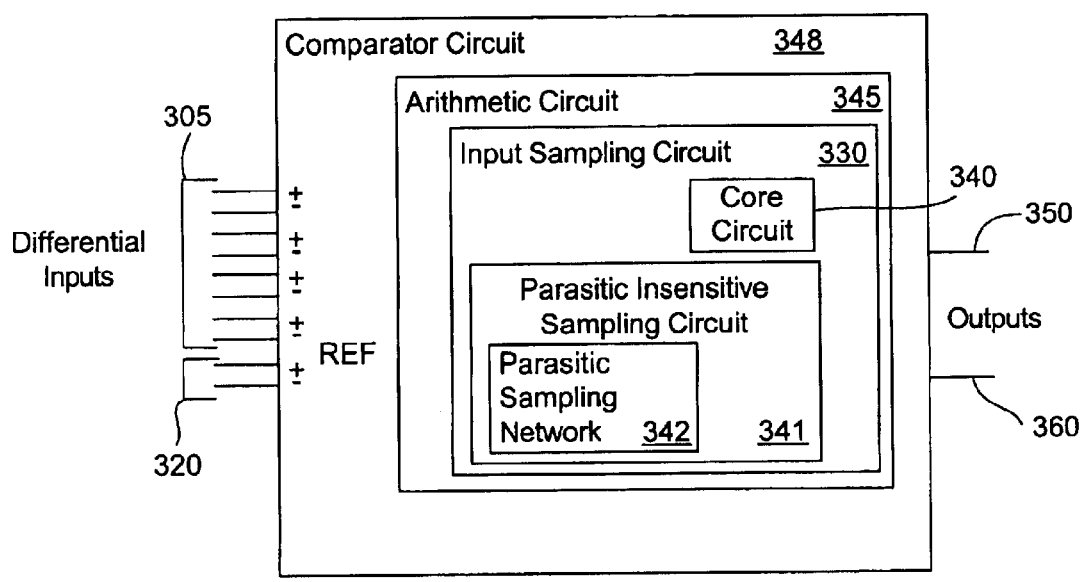
FIG. 3 is a block diagram of an AGC window detector comparator circuit.

FIG. 3 is a block diagram of an AGC window detector comparator circuit. The comparator circuit 348 compares five differential voltages simultaneously: four differential analog voltages 305 and one reference voltage 320. The arithmetic circuit 345 is capable of adding and subtracting the differential analog voltages 305, 320 simultaneously and determining the polarity of the resulting voltage. The differential voltages are sampled by the input sampling circuit 330 via the parasitic insensitive sampling circuit 341. The parasitic insensitive sampling circuit 341 further utilizes a parasitic sampling network 342 to provide the addition and subtraction of the analog voltages. The resulting signal is transmitted to the core circuit 340 resulting in a positive 350 and negative 360 output digital signal. The core circuit 340 consists of a minimum number of subcircuits necessary to support the functionality previously described. These subcircuits include an output offset canceled preamplifier, an input offset canceled preamplifier, a regenerative latch, a set-reset latch and biasing circuit.

Figure 4:
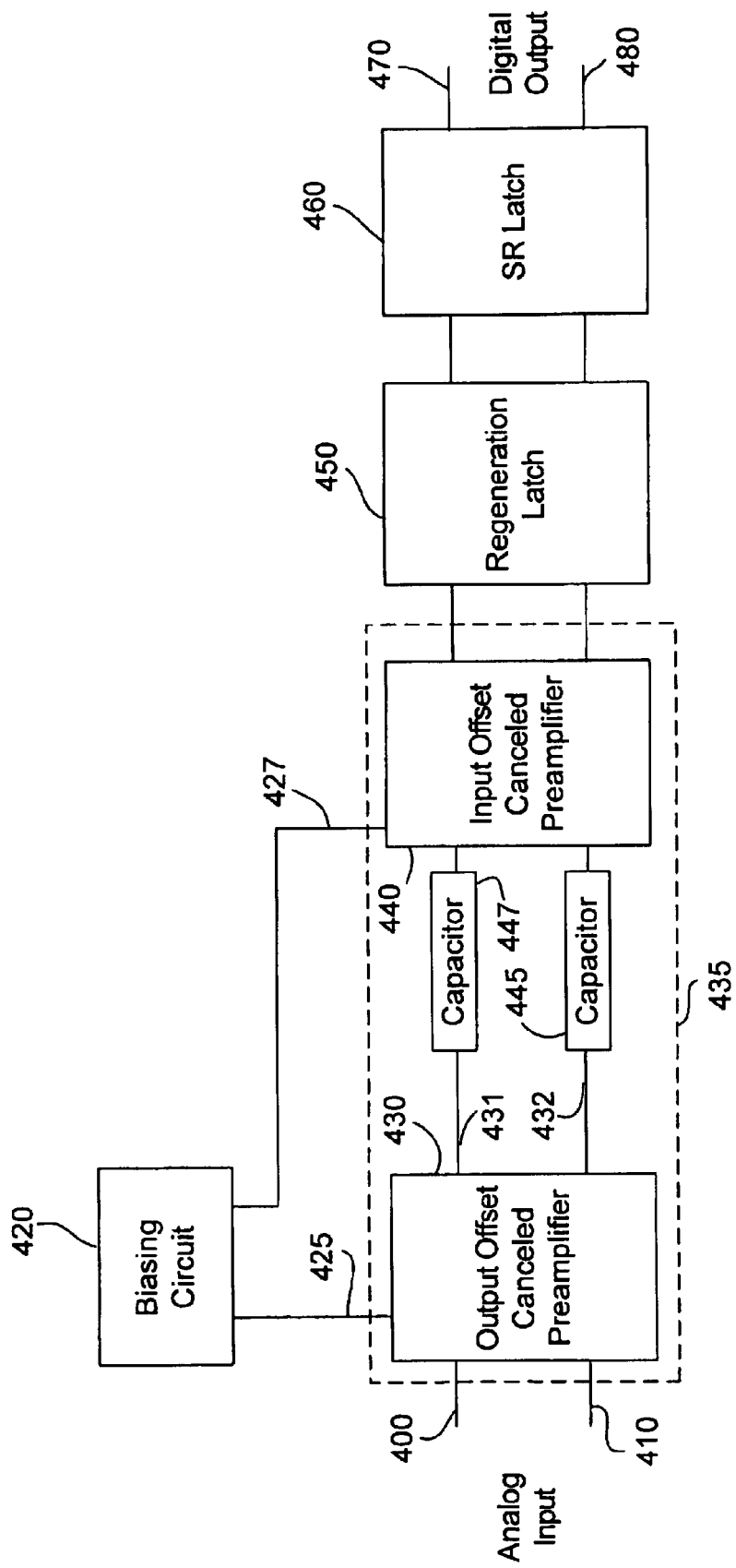
FIG. 4 is a block diagram of an AGC window detector core circuits.

FIG. 4 is a block diagram of an AGC window detector core circuits. A positive 400 and a negative 410 component of the combined in-phase and quadrature low level input signal is transmitted into an amplifier circuit 435. The amplifier circuit includes the output offset canceled preamplifier 430 and input offset canceled preamplifier 440. The signals are then routed between the output offset canceled preamplifier 430 and the input offset canceled preamplifier 440 via capacitors 445, 447 for amplification of a low level signal. The capacitors 445, 447 reduce the output offset signals 431, 432 between the output offset canceled preamplifier 430 and the input offset canceled preamplifier 440. A biasing circuit 420 generates two nominally identical voltages for the tail current sources 425, 427 of the two preamplifiers. The biasing circuit 420 helps to reduce cross talk between the preamplifiers. The input offset canceled preamplifiers 440 output is transmitted to the regeneration latch 450 and then to the set-reset latch 460 to produce a positive and negative 470, 480 digital output for the core circuit network.

Figure 5:
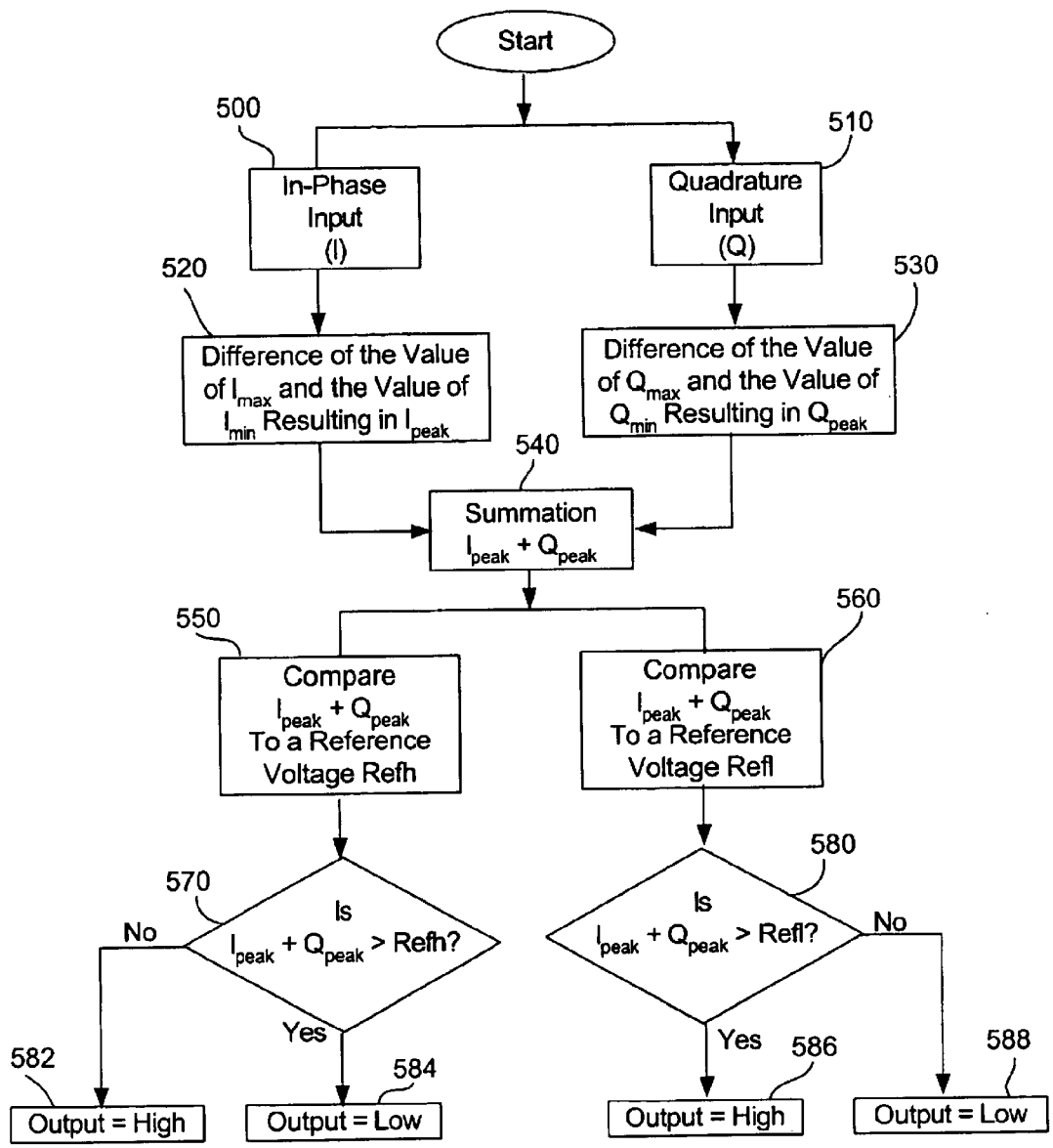
FIG. 5 is a flow diagram illustrating a general signal transition through the AGC window detector.

FIG. 5 is a flow diagram illustrating a general signal transition thought the AGC window detector. The maximum and minimum in-phase 500 and quadrature 510 signals are input into the comparator circuits. The difference of the in-phase maximum with the value of the in-phase minimum signal results in the in-phase peak-to-peak value 520. The difference of the quadrature maximum signal and the value of the quadrature minimum signal results in a quadrature peak-to-peak value 530. The addition 540 of the in-phase peak-to-peak value plus the quadrature peak-to-peak value are compared to the reference voltage Refh 550 and to Refl 560. If the resulting signal of the in-phase peak-to-peak value plus the quadrature peak-to-peak value is greater than Refh 570 the resulting output signal is low 584 otherwise the resulting output signal is high 582. If the addition of the in-phase peak-to-peak value plus the quadrature peak-to-peak value is greater than Refl 580 the resulting output is high 586 otherwise the resulting output is low 588.

Figure 6:
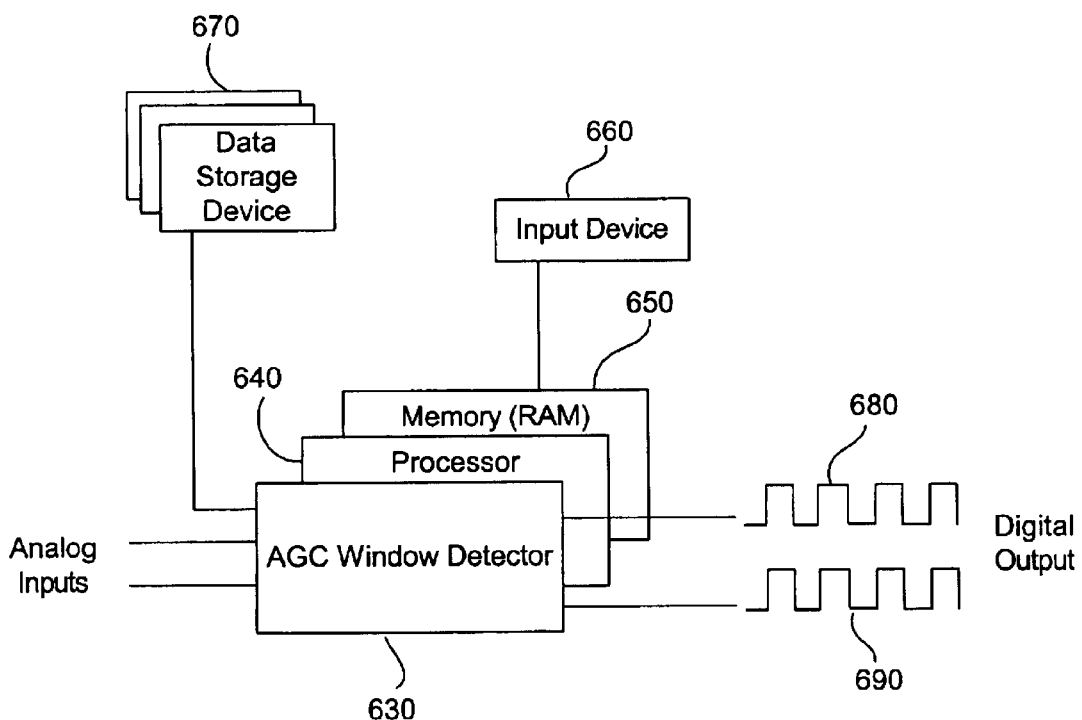
FIG. 6 is an exemplary hardware environment for the AGC window detector.

Referring to FIG. 6, another hardware environment for comparing multiple signals from a sources shown according to the present invention. The present invention may be implemented using an AGC window detector 630, comprised of a processor 640 and memory (RAM) 650. It is envisioned that attached to the detector 630 may be a memory device 650. Also included in this embodiment may be input devices 660, for downloading data and commands.

The detector 630 may operate under the control of an operating system. The detector 630 executes one or more computer programs under the control of the operating system.

Generally, the operating system and the detector programs may be tangibly embodied in a computer-readable medium or carrier, e.g. one or more of the fixed or removable data storage devices 670, or other data storage or data communications devices. Both operating system and the computer programs may be loaded from the data storage devices into the memory 650 of the detector 630 for execution by the processor 640. Those skilled in the art will recognize that the memory 650 is optional, or may be a memory device embedded or otherwise couple to the AGC detector 630. Both the operating system and the detector programs comprise instructions which, when read and executed by the processor 640, cause the detector to perform the steps necessary to execute the steps or elements of the present invention. The resulting digital output 680, 690 is produced.

Although one detector system configuration is illustrated in FIG. 6, those skilled in the art will recognize that any number of different configurations performing similar functions may be used in accordance with the present invention.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A detector circuit for comparing multiple signals from a source, comprising:
    a first comparator circuit for computing a difference of a first input signal having a peak-to-peak value and a second input signal having a peak-to-peak value, and comparing the difference of the first and second input signals relative to a high reference voltage to produce a first output signal; and
    a second comparator circuit for computing a difference between the first input signal and the second input signal, and comparing the difference of the first and second input signals relative to a low reference voltage to produce a second output signal;
    wherein the first and second output signals indicate whether the difference of the first and second input signals is within a reference window defined by the high and the low reference voltages.

2. The detector circuit of claim 1, wherein the first and second comparator circuit further comprises an arithmetic circuit for computing the difference between the value of the first input and second input signal and the sum of the first input and the second input signal.

3. The detector circuit of claim 2, wherein the arithmetic circuit computes the difference between a maximum in-phase signal value and a minimum in-phase signal value and computes the difference between a maximum quadrature signal value and a minimum quadrature signal value resulting in a peak-to-peak in-phase value of the input signals and a peak-to-peak quadrature value of the input signals respectively.

4. The detector circuit of claim 2, wherein the arithmetic circuit further comprises a sampling circuit to sample the peak-to-peak in-phase and quadrature signals.

5. The detector circuit of claim 4, wherein the sampling the peak-to-peak in-phase and quadrature signals further performs an addition and a subtraction of the peak-to-peak in-phase and quadrature signals to determine a polarity of a resulting signal.

6. The detector circuit of claim 5, wherein the subtraction of the in-phase and quadrature signals further computes the difference between the in-phase and the quadrature signal by reversing a polarity of a positive and a negative input component of the in-phase and quadrature signal.

7. The detector circuit of claim 4, wherein the sampling circuit further comprises a parasitic insensitive sampling circuit for sampling the in-phase and quadrature signals via a parasitic insensitive sampling network.

8. The detector circuit of claim 7, wherein the parasitic insensitive sampling network further accomplishes the addition and subtraction by a charge sharing of parallel capacitors.

9. The detector circuit of claim 4, wherein the sampling circuit further comprises an amplifier circuit for an output offset preamplifier, coupled to an input offset preamplifier, to amplify a low level signal.

10. The detector circuit of claim 9, wherein the amplifier circuit further comprises a capacitor for the reduction of an output offset voltage between the output offset preamplifier and the input offset preamplifier.

11. The detector circuit of claim 4, wherein the sampling circuit further comprises a regeneration latch for retaining a voltage level.

12. The detector circuit of claim 4, wherein the sampling circuit further comprises a set-reset latch for resetting to a predetermined voltage level.

13. The detector circuit of claim 4, wherein the sampling circuit further comprises a biasing circuit for generating a plurality of nominally identical voltages for reducing cross talk between a plurality of preamplifiers.

14. The detector circuit of claim 13, wherein reducing cross talk further comprises a tail current source to provide a tail current for a plurality of preamplifiers.

15. The detector circuit of claim 1 further comprising a reference voltage generator, coupled to the first and second comparator circuits, for supplying the refernce voltage.

16. The detector circuit of claim 15, wherein reference voltage generator further comprises a current from a bandgap reference that is inversely proportional to a resistance of a polysilicon resistor by forcing this current across a resistor ladder.

17. The detector circuit of claim 15, wherein the reference voltage generator further comprises a control signal to regulate the reference voltage wherein the control signal varies a hysteresis window.

18. A system for comparing multiple signals from a source, comprising:
an antenna to retrieve a propagated signal;
a detector, coupled to the antenna, for receiving the retrieved signal and generating an input signal;
a window detector, coupled to the detector, for comparing the input signal with a reference voltage to generate a digital output in response thereto, wherein the window detector further comprises:
a first comparator circuit for computing a differential signal from a first input signal and a differential signal from a second input signal, computing a difference of the differential signals, and comparing the difference of the differential signals relative to a high reference voltage to produce a first output signal; and
a second comparator circuit for computing a differential signal from the first input signal and a differential signal from the second input signal, computing a difference of the differential signals, and comparing the difference relative to a low reference voltage to produce a second output signal;
wherein the first and second output signals indicate whether the difference of the differential signals of the first and second input signals is within a reference window defined by the reference voltages.

19. The system of claim 18, wherein the first and second comparator circuits further comprise an arithmetic circuit for computing the difference between the differential value of the first and second input signals and a sum of the first and the second input signals.

20. The system of claim 19, wherein the arithmetic circuit computes the difference between a maximum in-phase signal value and a minimum in-phase signal value and computes the difference between a maximum quadrature signal value and a minimum quadrature signal value resulting in a differential in-phase value of the input signals and a differential quadrature value of the input signals respectively.

21. The system of claim 19, wherein the arithmetic circuit further comprises a sampling circuit for sampling the differential in-phase and quadrature signals.

22. The system of claim 21, wherein the sampling the differential in-phase and quadrature signals further performs an addition and a subtraction of the differential in-phase and quadrature signals to determine a polarity of a resulting signal.

23. The system of claim 22, wherein the subtraction of the differential in-phase and quadrature signals further computes the difference between the in-phase and the quadrature signal by reversing a polarity of a positive and a negative input component of the in-phase and quadrature signal.

24. The system of claim 21, wherein the sampling circuit further comprises a parasitic insensitive sampling circuit for sampling the in-phase and quadrature signals via a parasitic insensitive sampling network.

25. The system of claim 24, wherein the parasitic insensitive sampling network further accomplishes the addition and the subtraction by a charge sharing of parallel capacitors.

26. The system of claim 21, wherein the sampling circuit further comprises an amplifier circuit for an input offset preamplifier, coupled to an output offset preamplifier, for amplifying a low level signal.

27. The system of claim 26, wherein the amplifier circuit further comprises a capacitor for cancellation of an output voltage offset between the output offset preamplifier and the input offset preamplifier.

28. The system of claim 21, wherein the sampling circuit further comprises a regeneration latch for retaining a voltage level.

29. The system of claim 21, wherein the sampling circuit further comprises a set-reset latch for resetting to a predetermined voltage level.

30. The system of claim 21, wherein the sampling circuit further comprises a biasing circuit for generating a plurality of nominally identical voltages for reducing cross talk between a plurality of preamplifiers.

31. The system of claim 30, wherein reducing cross talk further comprises a tail current source to provide a tail current for the plurality of preamplifiers.

32. The system of claim 18 further comprising a reference voltage generator for supplying the reference voltage.

33. The system of claim 32, wherein the reference voltage generator further comprises a current from a bandgap reference that is inversely proportional to a resistance of a polysilicon resistor by forcing this current across a resistor ladder.

34. The system of claim 32, wherein the reference voltage generator further comprises a control signal to regulate the reference voltage, wherein the control signal varies a hysteresis window.

35. An article of manufacture for providing AGC window detection, the article of manufacture comprising a computer readable medium having instructions for comparing multiple signals from a source comprising:

computing with a first comparator a peak-to-peak value for a first input signal and a peak-to-peak value for a second input signal, adding the peak-to-peak values of the first and second input signals, and comparing the added peak-to-peak values relative to a high reference voltage to produce a first output signal; and computing with a second comparator a peak-to-peak value for the first input signal and a peak-to-peak value for the second input signal, adding the peak-to-peak values of the first and second input signals, and comparing the added peak-to-peak values relative to a low reference voltage to produce a second output signal;

wherein the first and second output signals indicate whether the addition of the peak-to-peak values of the first and second input signals is within a reference window defined by the high and low reference voltages.

36. A method of comparing multiple signals from a source, comprising:

computing the difference between a first input signal having peak-to-peak value and a second input signal having a peak-to-peak value;

comparing the computed difference relative to a high reference voltage with a first comparator to produce a first output signal; and comparing the computed difference relative to a low reference voltage with a second comparator to produce a second output signal;

wherein the first and second output signals indicate whether a difference of the first and second input signals is within a reference window defined by the high and low reference voltages.

37. The method of claim 36, wherein the computing the difference between the value of the first and second input signal further comprises computing the difference between a maximum in-phase signal value with a minimum in-phase signal value and computing the difference between a maximum quadrature signal value with a minimum quadrature signal value resulting in a differential in-phase value of the input signals and a differential quadrature value of the input signals respectively.

38. The method of claim 37, wherein the computing the difference between the in-phase and quadrature signal further comprises sampling the differential in-phase and quadrature signals.

39. The method of claim 38, wherein the sampling the differential in-phase and quadrature signal further comprises computing an addition and a subtraction of the differential in-phase and quadrature signal voltages to determine a polarity of a resulting voltage.

40. The method of claim 39, wherein the subtraction of the differential in-phase and quadrature voltage further comprises reversing the polarity of the positive and negative components of the in-phase and quadrature signal.

41. The method of claim 39, wherein the computing the addition and the subtraction further comprises sampling the differential in-phase and quadrature voltage via a parasitic insensitive sampling circuit comprising a capacitor.

42. The method of claim 41, wherein the parasitic insensitive sampling circuit further comprises accomplishing the addition and the subtraction by a charge sharing of parallel capacitors.

43. The method of claim 38, wherein the sampling the differential in-phase and quadrature signal further comprises preamplifying a low level signal.

44. The method of claim 38, wherein the sampling the differential in-phase and quadrature signal further comprises latching a voltage level.

45. The method of claim 38, wherein the sampling the differential in-phase and quadrature signal further comprises generating a plurality of nominally identical voltages to reduce cross talk in a preamplified low level signal.

* * * * *